US012619808B2

(12) United States Patent
Presti et al.

(10) Patent No.: US 12,619,808 B2
(45) Date of Patent: May 5, 2026

(54) APPARATUS AND METHODS FOR PROGRAMMING MULTIPLE PARAMETERS PER PIN OF AN INTEGRATED CIRCUIT

(71) Applicant: Analog Devices, Inc., Wilmington, MA (US)

(72) Inventors: Armando Presti, Austin, TX (US); Gregory J. Manlove, Colorado Springs, CO (US); Douglas Huhmann, Austin, TX (US)

(73) Assignee: Analog Devices, Inc., Wilmington, MA (US)

( * ) Notice: Subject to any disclaimer, the term of this patent is extended or adjusted under 35 U.S.C. 154(b) by 717 days.

(21) Appl. No.: 18/057,923

(22) Filed: Nov. 22, 2022

(65) Prior Publication Data

US 2024/0169131 A1 May 23, 2024

(51) Int. Cl.
G06F 30/32 (2020.01)
G01R 19/00 (2006.01)

(52) U.S. Cl.
CPC ............. G06F 30/32 (2020.01); G01R 19/00 (2013.01)

(58) Field of Classification Search
CPC ................................ G06F 30/32; G01R 19/00
USPC ........................................................ 716/101
See application file for complete search history.

(56) References Cited

U.S. PATENT DOCUMENTS

| | | | |
|---|---|---|---|
| 6,700,403 B1 * | 3/2004 | Dillon ................. | G06F 13/4072 |
| | | | 327/108 |
| 7,126,513 B1 * | 10/2006 | Zinn ..................... | H04L 25/062 |
| | | | 341/139 |
| 8,022,723 B1 | 9/2011 | Wang et al. | |
| 8,446,169 B1 | 5/2013 | Marlett et al. | |
| 8,957,700 B2 | 2/2015 | Nelson | |
| 2002/0057102 A1 | 5/2002 | Kim | |
| 2002/0104031 A1 * | 8/2002 | Tomlinson ................ | G06F 1/24 |
| | | | 713/320 |
| 2004/0008725 A1 * | 1/2004 | McNamara ......... | G06F 13/4291 |
| | | | 370/395.5 |
| 2007/0043988 A1 * | 2/2007 | Sutardja ........... | G11C 29/50008 |
| | | | 714/724 |
| 2007/0103189 A1 | 5/2007 | Chang et al. | |
| 2008/0303546 A1 | 12/2008 | Millar | |
| 2021/0365325 A1 * | 11/2021 | Seger, Jr. ................. | H04L 1/00 |

OTHER PUBLICATIONS

Analog Devices, 1.6 GHz Clock Distribution IC, Dividers, Delay Adjust, Two Outputs, AD9515 Data Sheet, 28 pages (Apr. 2012).
(Continued)

*Primary Examiner* — Suchin Parihar
(74) *Attorney, Agent, or Firm* — Knobbe, Martens, Olson & Bear, LLP

(57) ABSTRACT

Apparatus and methods for programming multiple parameters per pin of an IC are disclosed herein. In certain embodiments, system operation parameters of an IC are set using external component(s) in conjunction with an internal detection circuit of the IC. The internal detection circuit allows for programming of multiple parameters with one pin of the IC, thereby reducing package size, board area, and/or chip complexity. For example, the teachings herein allow for detection of three or more unique parameters or states per pin, significantly reducing the part pin count and board area.

20 Claims, 7 Drawing Sheets

(56)           References Cited

OTHER PUBLICATIONS

Analog Devices, Dual Input Multiservice Line Card Adaptive Clock
Translator, AD9557 Data Sheet, 92 pages (Mar. 2012).
Analog Devices, Dual Output PolyPhase Step-Down DC/DC Con-
troller with Digital Power System Management, LTC3880/
LTC3880-1 Data Sheet, 118 pages (Sep. 2019).

* cited by examiner

APPARATUS AND METHODS FOR PROGRAMMING MULTIPLE PARAMETERS PER PIN OF AN INTEGRATED CIRCUIT

FIELD OF THE DISCLOSURE

Embodiments of the invention relate to electronic devices, and more particularly, to programming parameters of integrated circuits.

BACKGROUND

An integrated circuit (IC) can include one or more pins used to program the IC. For example, the IC can include pins associated with a bus used for sequentially programming a state of the IC using, for instance, a microprocessor or an electrically erasable programmable read-only memory (EEPROM). Alternatively, the pins can be selectively tied to power high or power low supply voltages to configure the IC binarily. In other implementations, the pins can be used to program the IC using analog techniques, such as by using resistor dividers and/or resistor-set (R-set) configurations.

Conventional IC programming schemes can have a relatively large amount overhead and/or expense. For example, conventional IC programming schemes can occupy a relatively large circuit area, have a relatively high degree of complexity, and/or use a relatively large number of pins for programming.

SUMMARY OF THE DISCLOSURE

Apparatus and methods for programming multiple parameters per pin of an IC are disclosed herein. In certain embodiments, system operation parameters of an IC are set using external component(s) in conjunction with an internal detection circuit of the IC. The internal detection circuit allows for programming of multiple parameters with one pin of the IC, thereby reducing package size, board area, and/or chip complexity.

In one aspect, a circuit board includes one or more passive components, and an integrated circuit (IC). The IC includes a sense input pin connected to the one or more passive components, a memory configured to store one or more parameters of the IC, and a voltage and impedance sensing circuit configured to program the one or more parameters into the memory. The voltage and impedance sensing circuit including a controllable current source configured to control a current of the sense input pin, and a voltage measurement circuit configured to generate a measurement signal indicating a voltage of the sense input pin.

In another aspect, an IC includes a sense input pin configured to connect to one or more passive components that are external to the IC, a memory configured to store one or more parameters of the IC, and a voltage and impedance sensing circuit configured to program the one or more parameters into the memory. The voltage and impedance sensing circuit includes a controllable current source configured to control a current of the sense input pin, and a voltage measurement circuit configured to generate a measurement signal indicating a voltage of the sense input pin.

In another aspect, a method of programming an IC is provide. The method includes controlling a current of a sense input pin of the IC using a controllable current source of the IC, the sense input pin connected to one or more passive components that are external to the IC. The method further include generating a measurement signal indicating a voltage of the sense input pin using a voltage measurement circuit of the IC, and programming one or more parameters of the IC into a memory of the IC based on the voltage of the sense input pin.

DETAILED DESCRIPTION OF EMBODIMENTS

Figure 1:
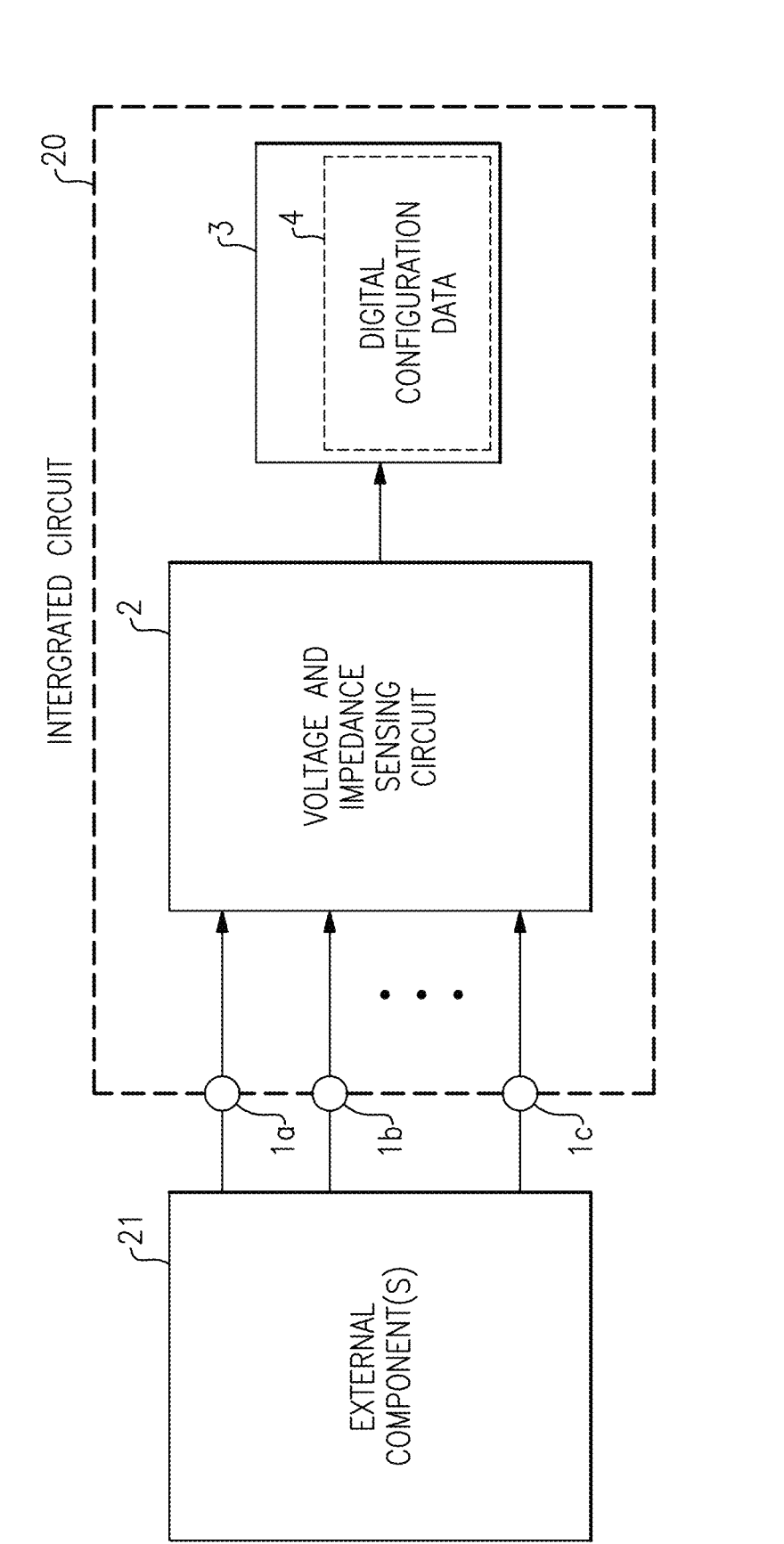
FIG. 1 is a schematic diagram of a circuit board with IC pin programming according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In many applications, it is desirable to have multiple parameters of an integrated circuit (IC) set with on-board components to assure correct operation or a part. For example, for the case in which the IC is a high phase count power supply, examples of parameters that may be set externally include device address, output voltage, output current limit, number of channels, and/or relative phasing. Although an example of an IC serving as a power supply has been provided, ICs can serve a wide variety of functions each with different desired parameters for programming.

To accommodate such programming, an IC can include pins used for sequential programming of the device. For example, an IC can include a serial peripheral interface (SPI) used to program registers of the IC when the IC is initialized. Although sequential programming can allow a relatively large amount of digital configuration data to be provided to the IC using a relatively small number of pins, sequential programming can have a relatively large overhead that may be cost prohibitive for certain applications.

Alternatively, an IC can include pins that are selectively tied to a power high or power low supply voltage (ground) by a user to digitally configure the IC. For example, a pin can be connected to the power high supply voltage to indicate a logical "1" or connected to ground to indicate a logical "0", or vice versa. Similarly, a single resistor or a resistor divider connected to a pin can be utilized to determine a parameter.

Although binary configuration can be effective in communicating a few bits of configuration data to an IC, such a configuration scheme can use a relatively large number of pins when the amount of digital configuration data is relatively large. For example, for most chips (including, but not limited to, ICs serving as power supplies), the number of pins cannot be easily increased due to size and cost constraints.

Apparatus and methods for programming multiple parameters per pin of an IC are disclosed herein. In certain embodiments, system operation parameters of an IC are set using external component(s) in conjunction with an internal detection circuit of the IC. The internal detection circuit allows for programming of multiple parameters with one pin of the IC, thereby reducing package size, board area, and/or chip complexity.

For example, the teachings herein allow for detection of three or more unique parameters or states per pin, significantly reducing the part pin count and board area.

FIG. 1 is a schematic diagram of a circuit board 30 with IC pin programming according to one embodiment. The circuit board 30 includes an IC 20 and one or more external components 21. An IC, such as the IC 20 of FIG. 1, is also referred to herein as a semiconductor die or chip. Such an IC can be mounted onto a circuit board, which can correspond to a portion of a package and/or to a larger circuit board on which other components and chips are attached.

In the illustrated embodiment, the IC 20 includes a first pin 1a, a second pin 1b, a third pin 1c, a voltage and impedance sensing circuit 2, and a memory 3. Although certain circuits and pins of the IC 20 are depicted, the IC 20 can include additional circuitry and pins which have been omitted for clarity of the figure.

The external component(s) 21 serve to program the memory 3 of the IC 20 with parameters used during operation of the IC 20. By choosing the number of, configuration of, and/or type of the external component(s) 21, digital configuration data 4 corresponding to the desired parameters of the IC 20 can be programmed into the memory 3.

Thus, the memory 3 is used to store the digital configuration data 4, which indicates parameters corresponding to a digital state or configuration of the IC 20. For example, the digital configuration data 4 can be used to configure the IC 20 such that the operational behavior of the IC 20 is different depending on the state of the digital configuration data 4. In one embodiment, the digital configuration data 4 includes at least 8 bits. However, implementations in which the digital configuration data 4 can be programmed to a large number of bits, for instance, 1000 or more, are possible. The memory 3 can include registers, memory cells, flip-flops, latches, and/or any other suitable memory elements, which can be volatile, non-volatile, or a combination thereof.

As shown in FIG. 1, one or more of first pin 1a, the second pin 1b, or the third pin 1c can be electrically connected to the external component(s) 21 for purposes of programming the IC 20. In particular, the impedance sensing circuit 2 can be used to modify or change the digital configuration data 4 to one of the possible bit values based on sensing the external component(s) connected to the pins 1a-1c.

For example, an end-user of the IC 20 can connect an external passive network of a particular impedance to the pins 1a-1c, and the voltage and impedance sensing circuit 2 can determine a voltage of and/or detect the impedance of the external passive network. Additionally, the voltage and impedance sensing circuit 2 can change or set the digital configuration data 4 of the memory elements 3 based on the detected voltage and impedance. In certain implementations, the detected voltage and impedance of the external passive network is used to digitally configure the IC 20, but the operation of the IC 20 is otherwise unrelated to the impedance of the external passive network.

In certain implementations, the external component(s) 21 include a passive electronic circuit external to the IC 20 that includes one or more resistors and/or capacitors. In one example, the external component(s) 21 can be selected to be a discrete resistor, a resistive voltage divider (also referred to herein as a resistor divider), or a resistive voltage divider in combination with a capacitor.

In certain implementations, the voltage and impedance sensing circuit 21 includes a voltage measurement circuit for measuring a pin voltage, and a controllable current source for selectively sinking or sourcing a controllable pin current. Additionally, an output of the voltage detector can be observed by a slope detector to determine the parameters that are programmed into the memory 3. For example, in one embodiment, the first pin 1a is a power supply pin, the second pin 1b is a sense input pin, and the third pin 1c is a ground pin. Additionally, different combinations of passive components are connected to the pins 1a-1c, and the voltage measurement circuit measures the voltage of the second pin 1b over time as current is sunk from or sourced onto the second pin 1b.

The voltage and impedance sensing circuit 2 can be configured to digitally configure the IC 20 at any suitable time. For example, the voltage and impedance sensing circuit 2 can digitally configure the IC 20 after activation of the IC's power supplies. In certain implementations, the voltage and impedance sensing circuit 2 can be configured to activate upon IC reset and/or at another designated time or condition.

Figure 2A:
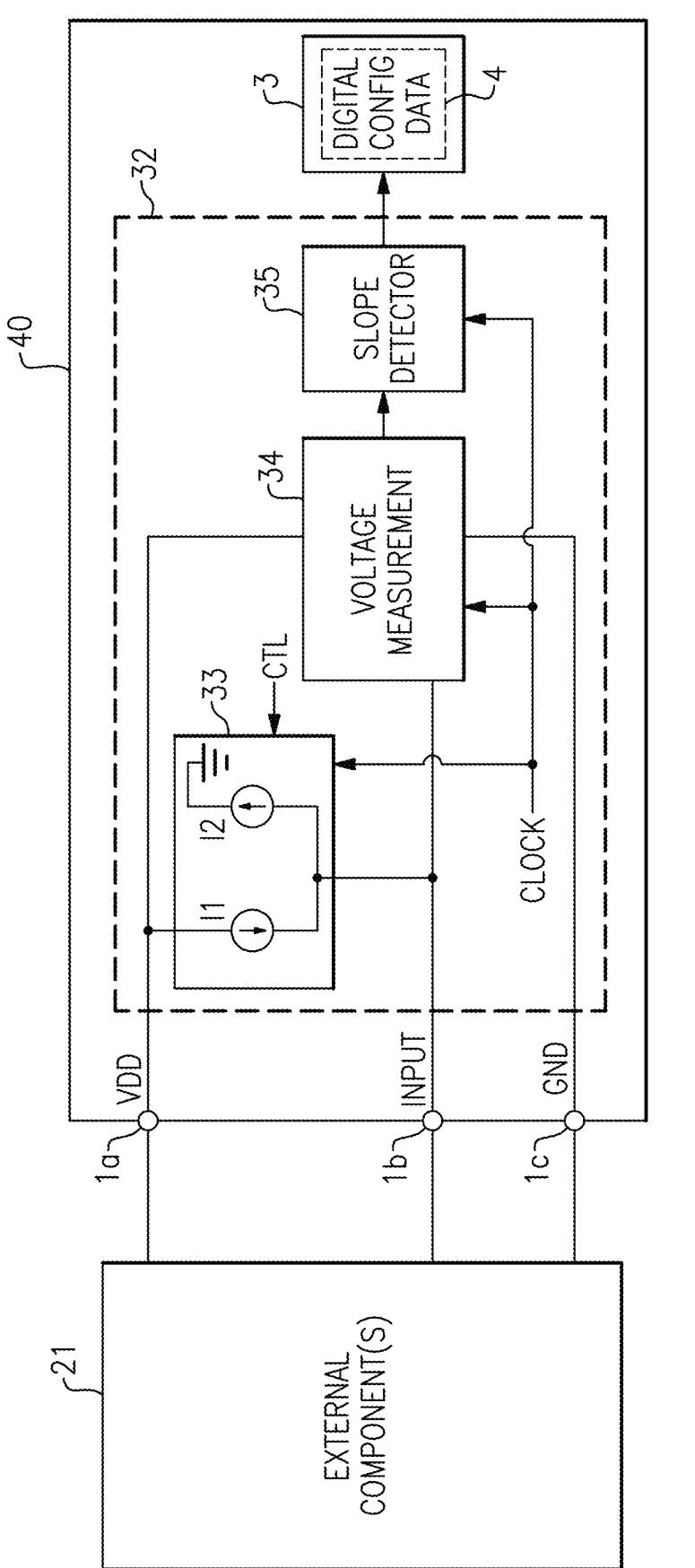
FIG. 2A is a schematic diagram of a circuit board with IC pin programming according to another embodiment.

FIG. 2A is a schematic diagram of a circuit board 51 with IC pin programming according to another embodiment. The circuit board 51 includes an IC 40 and one or more external components 21.

In the illustrated embodiment, the IC 40 includes a power supply pin 1a (VDD), a sense input pin 1b (INPUT), a ground pin 1c (GND), a voltage and impedance sensing circuit 32, and a memory 3. Additionally, the voltage and impedance sensing circuit 32 includes a controllable current source 33, a voltage measurement circuit 34, and a slope detector 35.

As shown in FIG. 2A, the controllable current source 33 includes an up current source I1 for sourcing current onto the sense input pin 1a and a down current source 12 for sinking or pulling a current from the sense input pin 1b. In this example, the up current source I1 is connected between the power supply pin 1a and the sense input pin 1b, while the down current source 12 is connected between the sense input pin 1b and the ground pin 1c.

The controllable current source 33 is controlled by a control signal CTL, which serves to both selectively enable/disable the controllable current source 33 as well as to set an amount of and a direction of the current of the sense input pin 1b. In certain implementations, the controllable current source 33 is also controlled by a clock signal CLOCK to aid in timing when the controllable current source 33 is turned on or off, an amount of current is changed, and/or a direction of current is changed. In certain implementations, the clock signal CLOCK serves to sequence the controllable current source 33, the voltage measurement circuit 34, and the slope detector 35.

With continuing reference to FIG. 2A, the voltage measurement circuit 34 serves to measure a voltage of the sense input pin 1b. In certain implementations, the voltage measurement circuit 34 measures the voltage of the sense input pin 1b based on timing of the clock signal CLOCK, for example, in response to a rising edge or a falling edge. The voltage measurement circuit 34 is connected to the power supply pin 1a and the ground pin 1c, which aids both in powering the voltage measurement circuit 34 in sensing the external component(s) 21 connected to the pins 1a-1c.

The voltage measurement circuit 34 can be implemented in a wide variety of ways including, but not limited to, using an analog-to-digital converter (ADC) or one or more comparators used to detect the voltage level of the sense input pin 1b.

As shown in FIG. 2A, the slope detector 35 is connected to an output of the voltage measurement circuit 34, and receives the clock signal CLOCK for providing a time base for slope detection. The slope detector 35 monitors the voltage measurements over time to detect the slope of the sense input pin 1b when a current is being provided by the controllable current source 33. For example, the slope detector 35 can be used to detect a resistor-capacitor (RC) time constant associated with the external component(s) 21. The value of the digital configuration data 4 (corresponding to the desired parameters for programming the IC 40) stored in the memory 3 can be based at least in part on the slope detected by the slope detector 35.

In certain implementations, the controllable current source 33, the voltage measurement circuit 34, the slope detector 35 work together to set one or more parameters of the IC 40. Examples of such parameter programming will now be described.

Figure 2B:
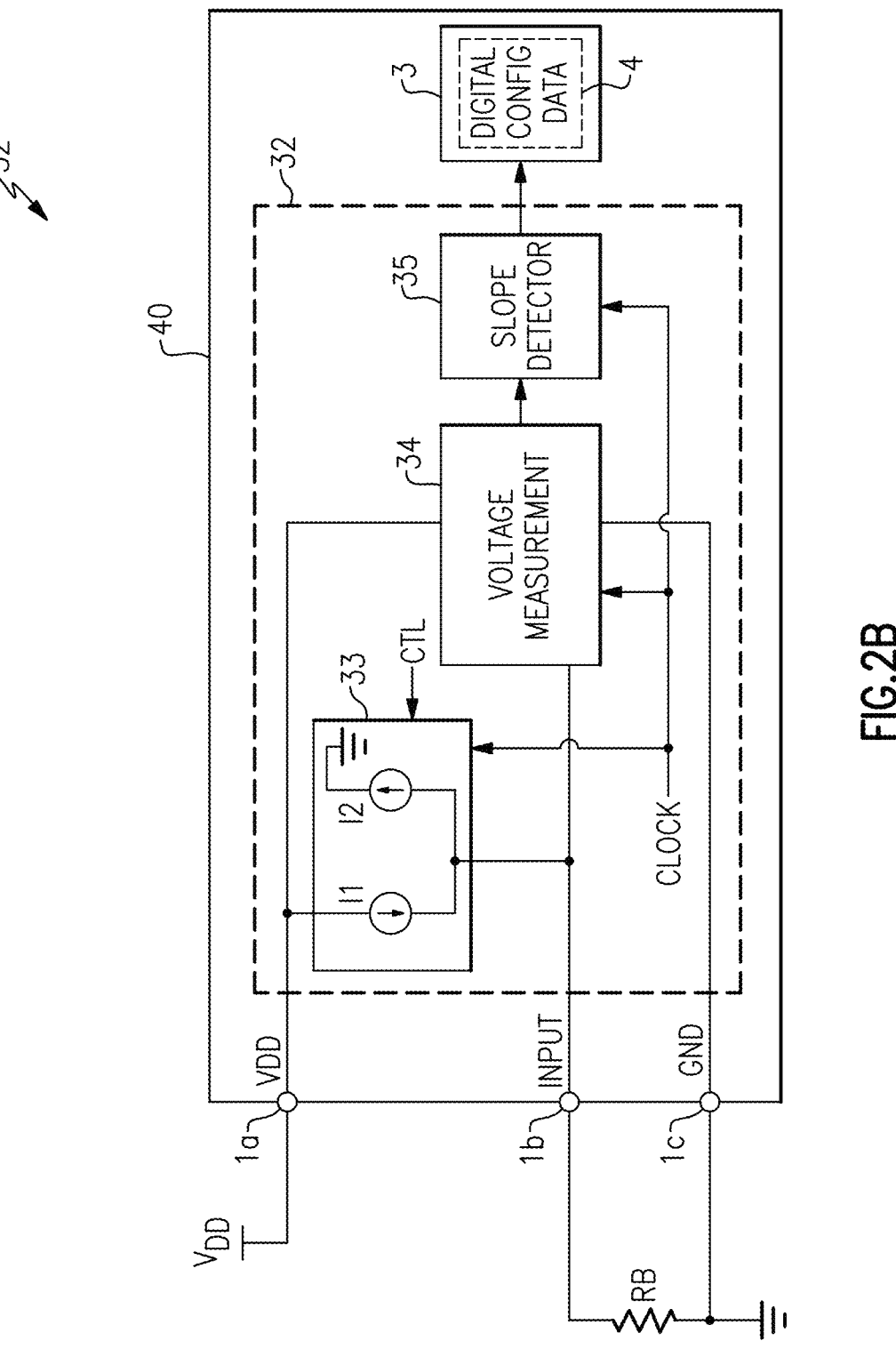
FIG. 2B is a first example of external components for programming the IC of FIG. 2A.
Figure 2C:
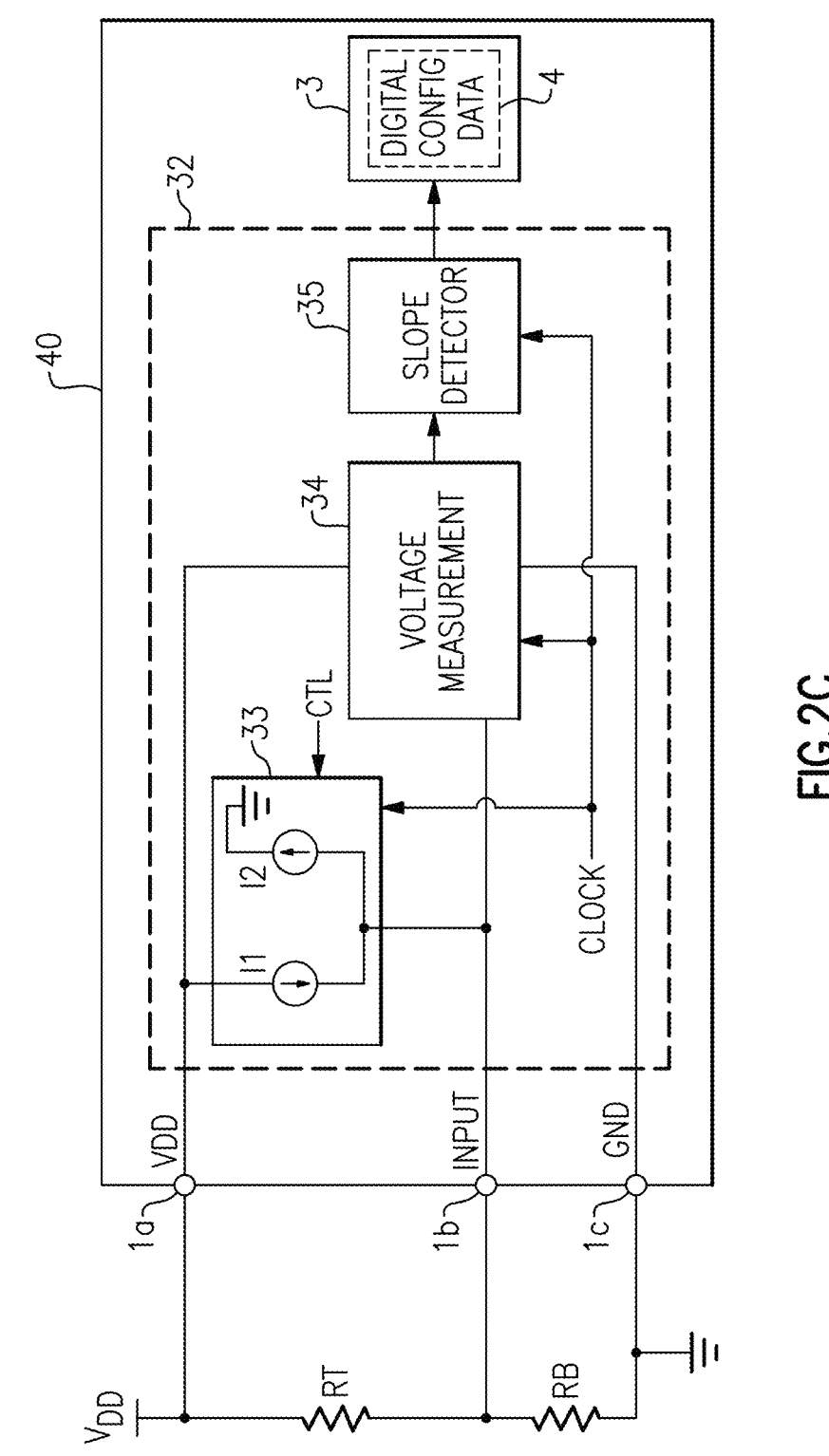
FIG. 2C is a second example of external components for programming the IC of FIG. 2A.
Figure 2D:
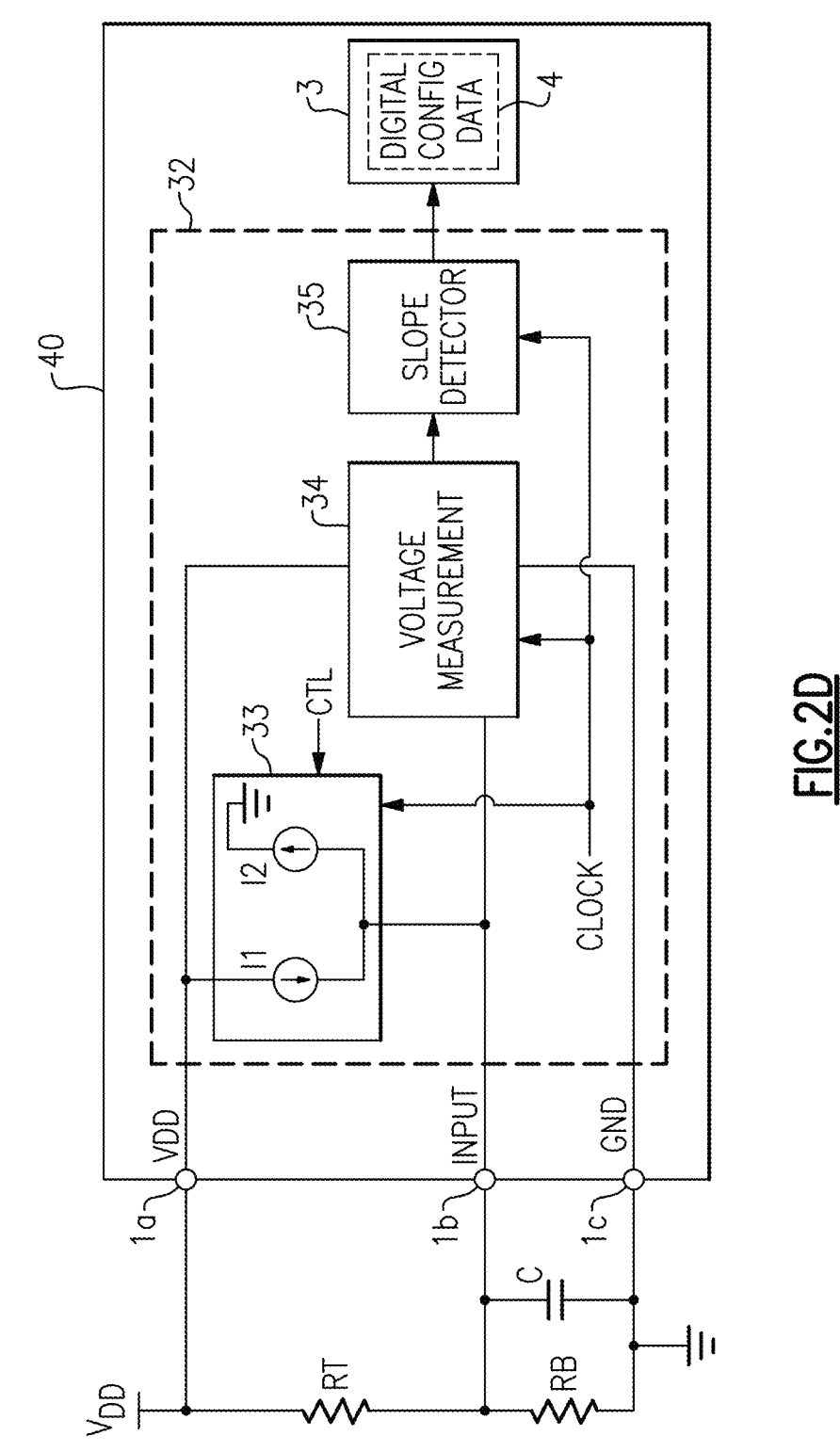
FIG. 2D is a third example of external components for programming the IC of FIG. 2A.

With reference to FIGS. 2B-2D, three example configurations of the external component(s) 21 of FIG. 2A are depicted. In particular, FIG. 2B is a first example configuration 52 in which a first resistor RB is connected between the sense input pin 1b and the ground pin 1c. Additionally, FIG. 2C is a second example configuration 53 in which a resistor divider is connected to the pins 1a-1c with a first resistor RB connected between the sense input pin 1b and the ground pin 1c and a second resistor RT connected between the supply voltage pin 1a and the sense input pin 1b. Furthermore, FIG. 2D is a third example configuration 54 in which a resistor divider (RB/RT) is connected to the pins 1a-1c as in FIG. 2C and in which a capacitor C is connected between the sense input pin 1b and the ground pin 1c.

Accordingly, in the examples of FIGS. 2B-2D, the sense input pin 1b is connected externally to either a resistor RB, a resistor divider (RB/RT), or to a resistor divider (RB/RT) and a capacitor C. Furthermore, internal to the IC 40 is the controllable current source 33, which serves to source or sink a current to the sense input pin 1b. The resulting voltage of the sense input pin 1b is measured by the voltage measurement circuit 34. Additionally, the clock signal CLOCK operates in conjunction with the slope detector 35 to provide a timing mechanism to accurately detect the rate of change in voltage of the sense input pin 1b as the current is applied by the controllable current source 33.

With reference to FIG. 2B, when a single resistor RB is connected, one parameter can be detected. For example, the initial voltage of the sense input pin 1b is at about 0V. In response to the voltage measurement circuit 35 detecting low input voltage, the controllable current source 33 is enabled to source current to the sense input pin 1b. The sourced current generates a unique voltage that is sensed by the voltage measurement circuit 34 and that is proportional to a resistance of the resistor RB. The detected voltage is used in a look up table to detect the input state and select the desired value of the programmable parameter to be stored in the memory 3. For example, the programmable parameter can have a value chosen (for instance, from 16 possible values) based on the detected voltage falling within a particular voltage range corresponding to that value.

With reference to FIG. 2C, when a resistor divider (RB/RT) is connected, two sets of parameters can be uniquely detected. For example, in this configuration an input voltage of non-zero is detected and measured by the voltage measurement circuit 34. Additionally, the defined voltages are detected as defined states and the look up table will be used to select the first parameter (for instance, from 16 possible values). Thereafter, a current from the controllable current source 33 is applied to the sense input pin 1b. The current may be chosen to source or sink depending on the initial input voltage of the sense input pin 1b and the common mode range of the voltage measurement circuit 34.

For example, for high input voltages, the current will be forced out of (sunk from) the pin 1b to reduce the pin's voltage and keep the input voltage within the operating range of the voltage measurement circuit 34. In contrast, for low input voltages, the current will be sourced to the pin 1b and the voltage will increase, presenting a voltage within the range of the voltage measurement circuit 34. The change in voltage from the applied current will be proportional to the input resistance of the resistor divider (RB/RT). The input resistance is then used to uniquely detect the second state and a look table is then applied to set the parameter (for instance, from 16 possible values). Because the states are separately detected as a function of the resistor divider and the input resistance, two parameters can be uniquely detected with multiple values for each parameter. For instance, for the case of 16 possible values for each parameter, 256 total bits of data can be programmed into the IC 40 from a single pin.

With reference to FIG. 2D, when a resistor divider (RB/RT) and a capacitor C are connected, three sets of parameters can be uniquely detected. For example, the input resistance and the initial input voltage set by the resistor divider and are detected in the manner described above. Furthermore, the capacitor modifies the rate of change when the current is applied by the controllable current source 33.

Thus, unique time constants can be detected by detecting the rate of change to the input voltage of the pin 1b. For example, this can be accomplished by running sufficient measurements (for example, ADC conversions) of the voltage measurement circuit 34 within a given period to detect the rate of change at the sense input pin 1b. Furthermore, an amount of time taken for the voltage of the sense input pin 1b is proportional to the resistor-capacitor (RC) time constant where the RC time constant is equal to (RT∥RB)*C. Since the three states are separately detected as a function of the resistor divider, input resistance, and input time constant, three parameters can be uniquely detected with multiple values for each parameter. For instance, for the case of 16 possible values for each parameter, 4096 total bits of data can be programmed into the IC 40 from a single pin.

In certain implementations, the measurement speed (for example, ADC conversion speed) of the voltage measurement circuit 34 is chosen to be greater than 5 times the RC time constant.

Figure 3A:
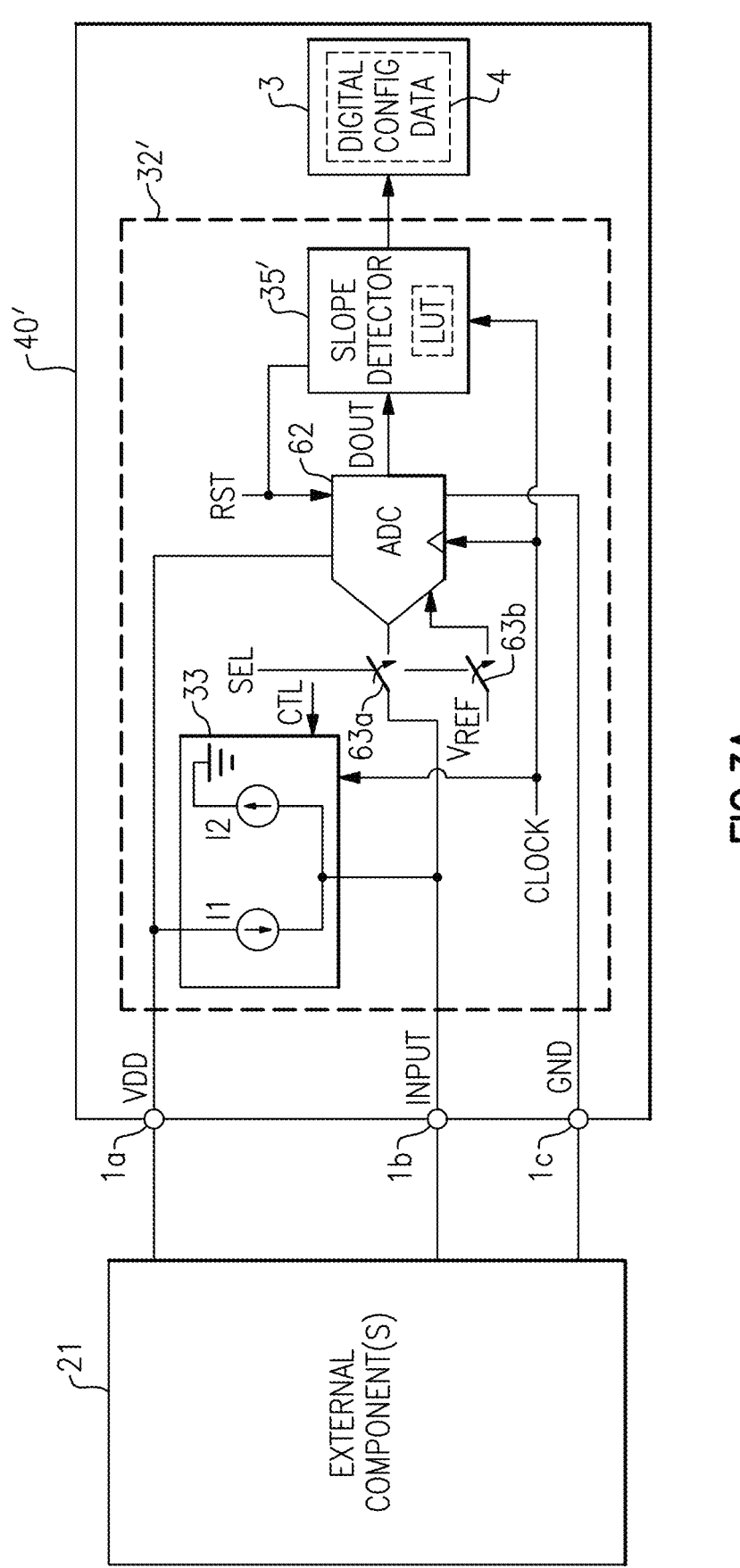
FIG. 3A is a schematic diagram of a circuit board with IC pin programming according to another embodiment.

FIG. 3A is a schematic diagram of a circuit board 61 with IC pin programming according to another embodiment. The circuit board 61 includes an IC 40' and one or more external components 21. The IC 40' includes a power supply pin 1a (VDD), a sense input pin 1b (INPUT), a ground pin 1c (GND), a voltage and impedance sensing circuit 32', and a memory 3. Additionally, the voltage and impedance sensing circuit 32' includes a controllable current source 33, a first input switch 34a (controlled by a select signal SEL), a second input switch 34*b* (controlled by the select signal SEL), an ADC 62, and a slope detector 35'.

The IC 40' of FIG. 3A is similar to the IC 40 of FIG. 2A, except that the IC 40' includes a specific implementation of voltage and impedance sensing and slope detection. In particular, in FIG. 3A, the ADC 62 samples the voltage of the sense input pin 1*b* when the selected signal SEL is active. The ADC 62 also receives a reference voltage VREF to aid in measuring the voltage. The ADC 62 provides a digital output signal DOUT, which is provided to the slope detector 35'. Furthermore, the slope detector 35' includes a look-up table (LUT) that can be used to look up parameter values for the memory 3 based on various input data signals based on the measured slope of the slope detector 35' and/or the digital output signal DOUT from the ADC 62. A reset signal RST aids in resetting the ADC 62 and the slope detector 35'.

Figure 3B:
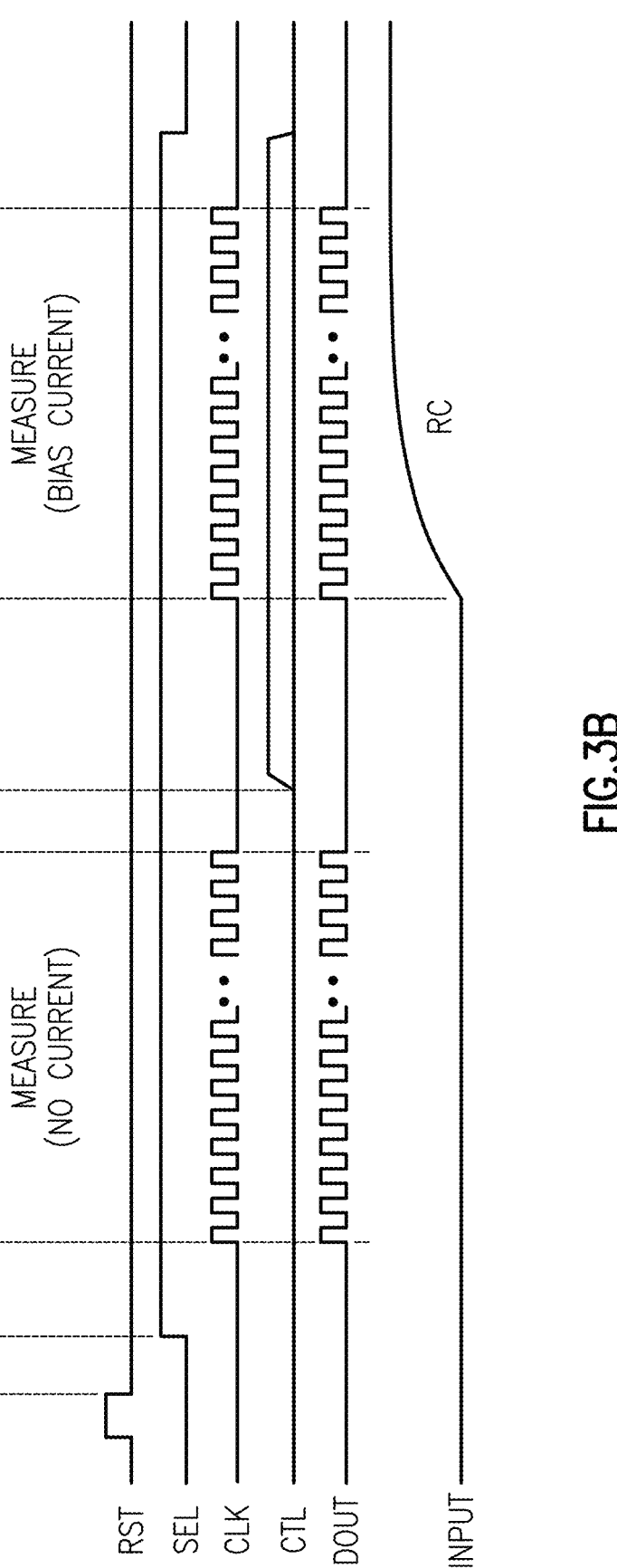
FIG. 3B is a plot of one example of signal waveforms for programming the IC of FIG. 3A.

FIG. 3B is a plot of one example of signal waveforms for programming the IC 40' of FIG. 3A. The example is taken for a scenario in which both a resistor divider and a capacitor are connected to the input sense pin 1*b*. Waveforms for the reset signal RST, the select signal SEL, the clock signal CLOCK, the control signal CTL, the digital output signal DOUT, and the voltage of the input sense pin 1*b* are shown.

As shown in FIG. 3B, initially a measurement occurs when no current is applied by the controllable current source 33. This allows for detection of a non-zero input voltage to be detected and measured by the ADC 62. Additionally, the defined voltages are detected as defined states and the LUT will be used to select the first parameter (for instance, from 16 possible values).

With continuing reference to FIG. 3B, thereafter a current from the controllable current source 33 is applied to the sense input pin 1*b*. The current may be chosen to source or sink depending on the initial input voltage of the sense input pin 1*b* and the common mode range of the ADC 62. For instance, in this example current is chosen to be sourced since the initial input voltage was sensed to be low. The detected input resistance at the pin 1*b* is used as input of the LUT to select the second parameter (for instance, from 16 possible values). Furthermore, the capacitor modifies the rate of change when the current is applied by the controllable current source 33. Thus, unique RC time constants can be detected by detecting the rate of change to the input voltage of the pin 1*b*. The detected RC time constant is used as input of the LUT to select the third parameter (for instance, from 16 possible values).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A circuit board comprising:
one or more passive components; and
an integrated circuit (IC) comprising:
a sense input pin connected to the one or more passive components;
a memory configured to store one or more parameters of the IC; and
a voltage and impedance sensing circuit configured to program, based on a measurement signal, the one or more parameters into the memory, the voltage and impedance sensing circuit including a controllable current source configured to control a current of the sense input pin, and a voltage measurement circuit configured to generate the measurement signal indicating a voltage of the sense input pin affected by the one or more passive components, wherein the one or more passive components are external to the IC.

2. The circuit board of claim 1, wherein the voltage measurement circuit is configured to measure an initial voltage of the sense input pin when the current of the controllable current source is turned off.

3. The circuit board of claim 2, wherein the controllable current source is configured to activate the current after the voltage measurement circuit measures the initial voltage.

4. The circuit board of claim 3, wherein the voltage and impedance sensing circuit is configured to control a direction of the current from the controllable current source based on the initial voltage and an input range of the voltage measurement circuit.

5. The circuit board of claim 3, wherein the voltage measurement circuit is configured to capture a plurality of voltage measurements of the sense input pin when the controllable current source is activated.

6. The circuit board of claim 1, wherein the one or more passive components includes a first resistor connected to the sense input pin, wherein the voltage and impedance sensing circuit is configured to program a parameter of the one or more parameters into the memory based on detecting a resistance of the one or more passive components.

7. The circuit board of claim 1, wherein the one or more passive components further includes a first resistor and a second resistor connected to form a resistor divider, wherein the voltage and impedance sensing circuit is further configured to program a parameter of the one or more parameters into the memory based on an analog input voltage set by the resistor divider.

8. The circuit board of claim 1, wherein the one or more passive components further includes a resistor and a capacitor connected to the sense input pin, wherein the voltage and impedance sensing circuit is further configured to program a parameter of the one or more parameters into the memory based on a detected resistor-capacitor (RC) time constant of the one or more passive components.

9. The circuit board of claim 1, wherein the controllable current source includes an up current source configured to source the current onto the sense input pin, and a down current source configured to sink the current from the sense input pin.

10. The circuit board of claim 1, wherein both a magnitude and a direction of the current are controllable.

11. The circuit board of claim 1, wherein the voltage measurement circuit includes an analog-to-digital converter (ADC) configured to output the measurement signal as a digital signal.

12. The circuit board of claim 1, wherein the integrated circuit further comprises a slope detector configured to process the measurement signal to detect a slope of the voltage of the sense input pin in response to the current, the voltage and impedance sensing circuit further configured to program the one or more parameters into the memory based on the slope.

13. The circuit board of claim 12, wherein the slope detector is configured to receive a clock signal indicating a time base for detecting the slope of the voltage of the sense input pin.

14. An integrated circuit (IC), comprising:
a sense input pin configured to connect to one or more passive components that are external to the IC;
a memory configured to store one or more parameters of the IC; and
a voltage and impedance sensing circuit configured to program, based on a measurement signal, the one or more parameters into the memory, the voltage and impedance sensing circuit including a controllable current source configured to control a current of the sense input pin, and a voltage measurement circuit configured to generate the measurement signal indicating a voltage of the sense input pin affected by the one or more passive components.

15. The IC of claim 14, further comprising a slope detector configured to process the measurement signal to detect a slope of the voltage of the sense input pin in response to the current, the voltage and impedance sensing circuit further configured to program the one or more parameters into the memory based on the slope.

16. The IC of claim 14 wherein the voltage and impedance sensing circuit is configured to program a parameter of the one or more parameters into the memory based on detecting a resistance at the sense input pin.

17. The IC of claim 14, wherein the voltage and impedance sensing circuit is further configured to program a parameter of the one or more parameters into the memory based on an analog input voltage of the sense input pin.

18. The IC of claim 14, wherein the voltage and impedance sensing circuit is further configured to program a parameter of the one or more parameters into the memory based on a detected resistor-capacitor (RC) time constant at the sense input pin.

19. A method of programming an integrated circuit (IC), the method comprising:
controlling a current of a sense input pin of the IC using a controllable current source of the IC, the sense input pin connected to one or more passive components that are external to the IC;
generating a measurement signal indicating a voltage of the sense input pin using a voltage measurement circuit of the IC, the voltage of the sense input pin affected by the one or more passive components; and
programming one or more parameters of the IC into a memory of the IC based on the measurement signal.

20. The method of claim 19, further comprising detecting a slope of the voltage of the sense input pin in response to the current using a slope detector that receives the measurement signal, and programming the one or more parameters based on the slope.

*     *     *     *     *